United States Patent
Chang et al.

(10) Patent No.: US 10,986,725 B2
(45) Date of Patent: Apr. 20, 2021

(54) LIGHT-EMITTING MODULE AND DISPLAY DEVICE

(71) Applicant: InnoLux Corporation, Miao-Li County (TW)

(72) Inventors: Chi-Liang Chang, Miao-Li County (TW); Wen-Chang Tsai, Miao-Li County (TW); Meng-Chieh Cheng, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 16/373,945

(22) Filed: Apr. 3, 2019

(65) Prior Publication Data

US 2019/0327827 A1 Oct. 24, 2019

Related U.S. Application Data

(60) Provisional application No. 62/659,789, filed on Apr. 19, 2018.

(30) Foreign Application Priority Data

Sep. 26, 2018 (CN) .......................... 201811125641.4

(51) Int. Cl.
*H01L 33/62* (2010.01)
*H01L 25/07* (2006.01)
*H05K 1/02* (2006.01)
*H01L 25/075* (2006.01)
*H05K 1/18* (2006.01)
*H05K 5/00* (2006.01)
*G06F 3/14* (2006.01)

(52) U.S. Cl.
CPC ....... *H05K 1/0269* (2013.01); *H01L 25/0753* (2013.01); *H05K 1/181* (2013.01); *H05K 5/0017* (2013.01); *H05K 5/0021* (2013.01); *G06F 3/1446* (2013.01); *H05K 2201/10106* (2013.01)

(58) Field of Classification Search
CPC ..... H01L 33/62; H01L 25/07; H01L 25/0753; H05K 1/02; H05K 1/0269
USPC .......................................................... 257/88
See application file for complete search history.

(56) References Cited

U.S. PATENT DOCUMENTS

| | | | |
|---|---|---|---|
| 10,186,549 B1 * | 1/2019 | Cheung | H01L 24/81 |
| 2010/0308350 A1 * | 12/2010 | Bisberg | H01L 33/58 |
| | | | 257/88 |
| 2015/0255438 A1 * | 9/2015 | Oraw | H01L 25/0753 |
| | | | 257/89 |

(Continued)

OTHER PUBLICATIONS

EP Extended Search Report dated Oct. 14, 2019 for the corresponding application No. 19169941.2 in Europe, pp. 1-8.

*Primary Examiner* — Fazli Erdem

(74) *Attorney, Agent, or Firm* — McClure, Qualey & Rodack, LLP

(57) ABSTRACT

A light-emitting module is provided. The light-emitting module includes a light-emitting structure and a carrying substrate. The light-emitting structure includes a plurality of light-emitting elements and a first positioning mark. The carrying substrate includes a second positioning mark. The light-emitting structure is fixed on the carrying substrate along a direction, and the first positioning mark and the second positioning mark overlap in the direction.

20 Claims, 13 Drawing Sheets

(56) References Cited

U.S. PATENT DOCUMENTS

2017/0323873 A1* 11/2017 Lin .................. H01L 24/00
2019/0393069 A1* 12/2019 Paranjpe ............ H01L 25/0753

* cited by examiner

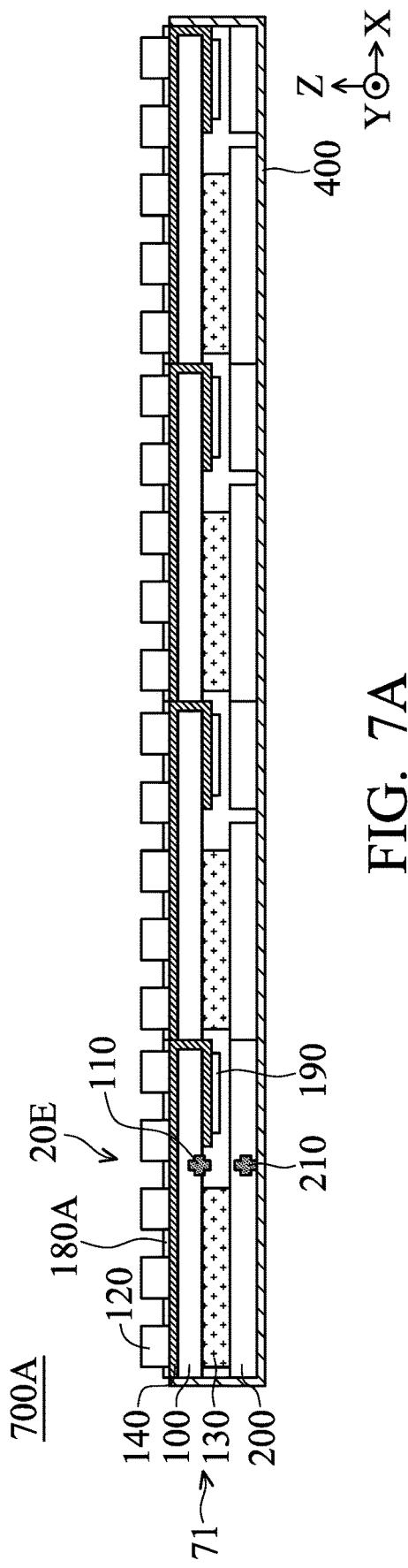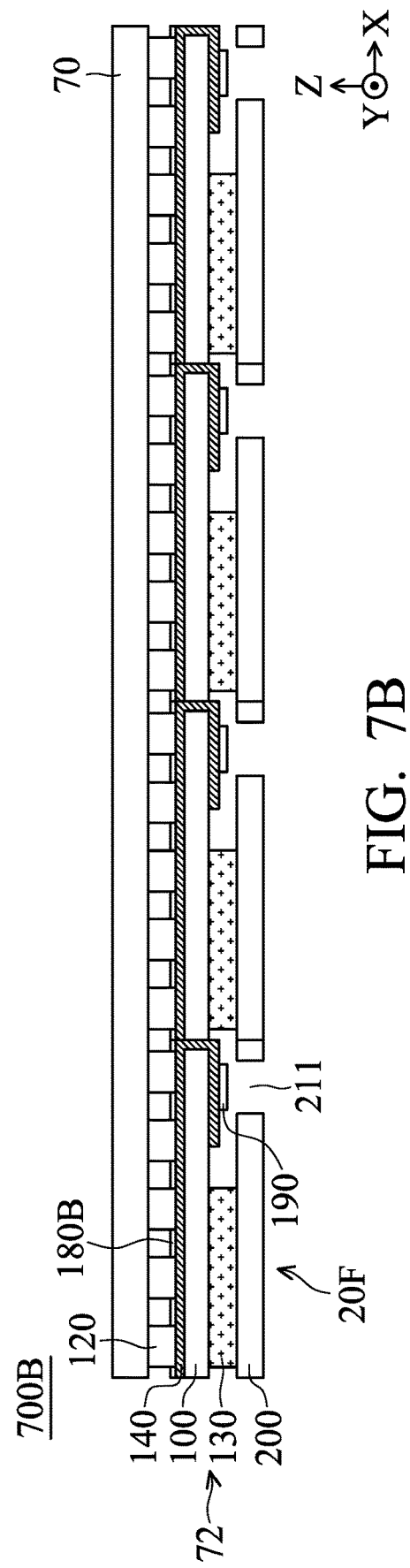
FIG. 7A
FIG. 7B

LIGHT-EMITTING MODULE AND DISPLAY DEVICE

CROSS REFERENCE TO RELATED APPLICATIONS

This application claims the benefit of U.S. Provisional Application No. 62/659,789, filed Apr. 19, 2018, and claims priority of China Patent Application No. 201811125641.4, filed Sep. 26, 2018, the entirety of which are incorporated by reference herein.

BACKGROUND

Field of the Disclosure

The disclosure relates in general to light-emitting modules, and in particular to a light-emitting module with positioning marks.

Description of the Related Art

As digital technology develops, display devices are used widely in many aspects of daily life, such as in televisions, computers, notebook computers, cell phones, smartphones, and other modern information devices. In addition, the application of large-sized display devices is becoming more and more popular nowadays. Currently, multiple light boards, where light-emitting elements are disposed, are combined (tiled) and disposed in the cabinet of the display device, serving as a large-sized display device. However, a seam may be visible at the border between two adjacent tiles, and the two adjacent tiles may be not aligned, affecting the appearance of the display device.

BRIEF SUMMARY

Some embodiments of the disclosure provide a light-emitting module. The light-emitting module includes a light-emitting structure and a carrying substrate. The light-emitting structure includes a plurality of light-emitting elements and a first positioning mark. The carrying substrate includes a second positioning mark. The light-emitting structure is fixed on the carrying substrate along a direction, and the first positioning mark and the second positioning mark overlap in the direction.

Some embodiments of the disclosure provide a tiled display device. The tiled display device includes a cabinet and a plurality of light-emitting modules. The light-emitting modules are disposed in the cabinet. At least one of the light-emitting modules includes a light-emitting structure and a carrying substrate. The light-emitting structure includes a plurality of light-emitting elements and a first positioning mark. The carrying substrate includes a second positioning mark. The light-emitting structure is fixed on the carrying substrate along a direction, and the first positioning mark and the second positioning mark overlap in the direction.

Some embodiments of the disclosure provide a display device. The display device includes a display panel and a light-emitting module. The light-emitting module provides a light source for the display panel, and includes a light-emitting structure and a carrying substrate. The light-emitting structure includes a plurality of light-emitting elements and a first positioning mark. The carrying substrate includes a second positioning mark. The light-emitting structure is fixed on the carrying substrate along a direction, and the first positioning mark and the second positioning mark overlap in the direction.

To clarify the features and advantages of the present disclosure, a detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein:

FIGS. 7A-7C are cross-sectional views illustrating the display device in accordance with some embodiments of the present disclosure.

DETAILED DESCRIPTION

Figure 1A:
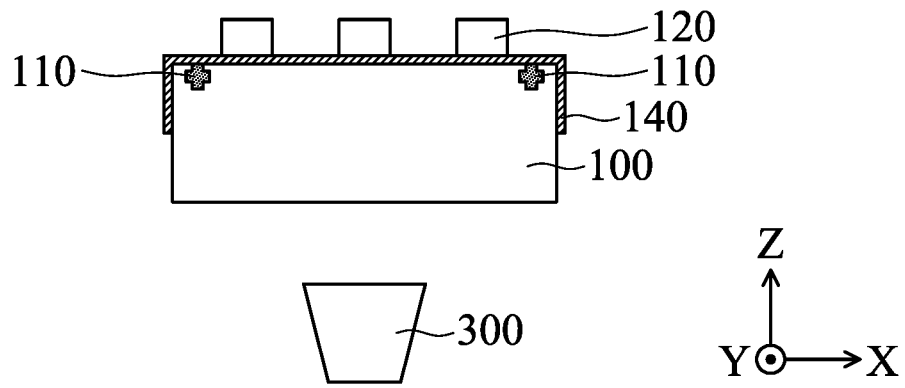
FIGS. 1A-1C are cross-sectional views illustrating an assembly process of a light-emitting module in accordance with some embodiments of the present disclosure.

The display devices and the light-emitting modules therein in accordance with some embodiments are described in detail in the following description. It should be appreciated that in the following detailed description provides various embodiments and examples in order to perform various configurations of some embodiments of the present disclosure. The specific elements and configurations described in the following detailed description are set forth in order to clearly describe some embodiments of the present disclosure. It will be apparent that the exemplary embodiments set forth herein are used merely for the purpose of illustration, and the inventive concept may be embodied in various forms without being limited to those exemplary embodiments. In addition, the drawings of different embodiments may use repeated numerals or marks. Those repetitions are merely in order to clearly describe some embodiments of the present disclosure. However, the use of repeated numerals in the drawings of different embodiments does not suggest any correlation between different embodiments and/or configurations. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

The terms "about", "substantially" and "approximately" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about", "substantially", or "approximately". The term "overlap" in the present disclosure can mean partially overlap or completely overlap.

It should be understood that, although the terms "first", "second", "third" etc. may be used herein to describe various elements, components, regions, layers and/or portions, and these elements, components, regions, layers, and/or portions should not be limited by these terms. These terms are merely used to distinguish one element, component, region, layer, or portion. Thus, a first element, component, region, layer or portion discussed below could be termed a second element, component, region, layer or portion without departing from the teachings of some embodiments of the present disclosure.

This description of the exemplary embodiments is intended to be read in connection with the accompanying drawings, which are to be considered part of the entire written description. It should be appreciated that the drawings are not drawn to scale. The shape and the thickness of embodiments may be exaggerated in the drawings to clarify the features of the present disclosure. In addition, structures and devices are shown schematically in order to clarify the features of the present disclosure.

In some embodiments of the present disclosure, relative terms such as "downwards," "upwards," "horizontal," "vertical,", "below," "above," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Figure 1B:
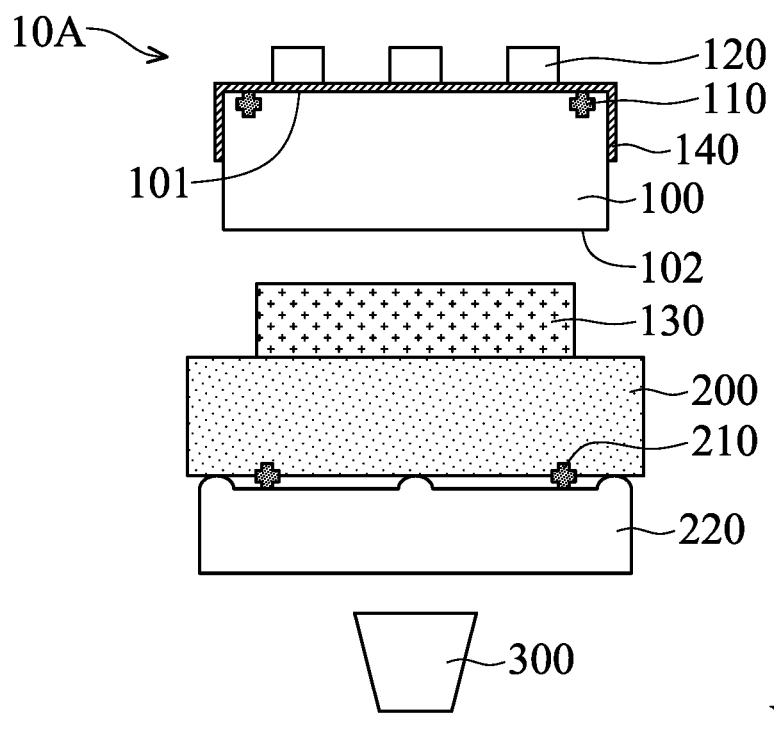
Figure 1C:
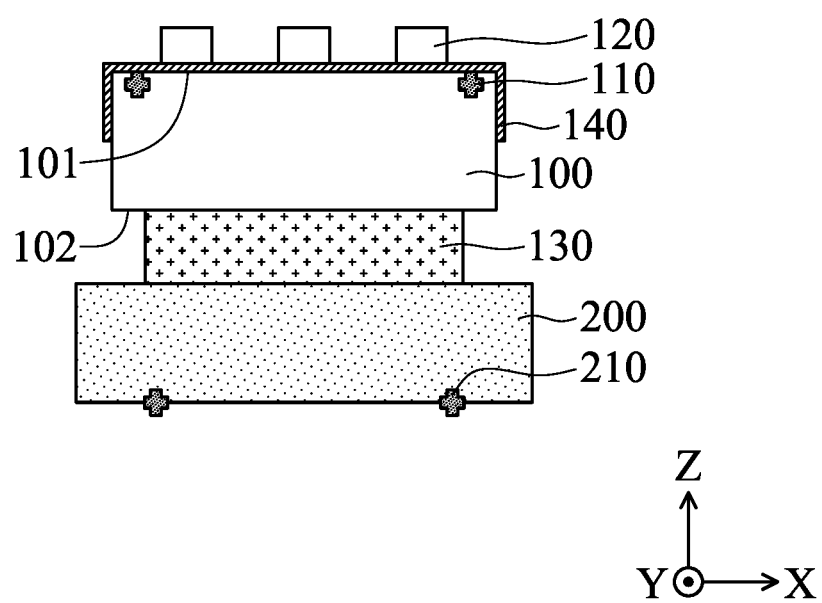

First, referring to FIGS. 1A-1C, FIGS. 1A-1C are cross-sectional views illustrating the assembly process of a light-emitting module 20A in accordance with some embodiments of the present disclosure. The light-emitting module 20A includes a light-emitting structure 10A, a carrying substrate 200, and a bonding layer 130 bonding the light-emitting structure 10A and the carrying substrate 200. The carrying substrate 200 can be disposed below and support the light-emitting structure 10A. As shown in FIG. 1A, the light-emitting structure 10A includes a substrate 100, a plurality of light-emitting elements 120, and a circuit board 140. The substrate 100 may include a transparent substrate, such as a glass substrate, a ceramic substrate, a plastic substrate, or any other suitable substrate, but the substrate 100 is not limited thereto. In the present embodiment, the circuit board 140 is disposed on the substrate 100, wherein the circuit board 140 includes an insulating layer and metal lines (not shown) formed in the insulating layer. For example, the circuit board 140 may be a printed circuit board, and the material of the insulating layer may be polyimide (PI) or any other suitable low-k insulating material, but the circuit board 140 is not limited thereto. The light-emitting elements 120 are disposed on the substrate 100, wherein the circuit board 140 is disposed between the light-emitting elements 120 and the substrate 100. In some embodiments, at least one of the light-emitting elements 120 is electrically connected to the circuit board 140. In some embodiments, for example, the light-emitting elements 120 are electrically connected to an external control unit (not shown) via the circuit board 140. The external control unit can transmit electrical signals to the light-emitting elements 120 to control the brightness of the light-emitting elements 120. It should be noted that although three light-emitting elements 120 are illustrated in the present embodiment, the number of light-emitting elements 120 is not limited thereto, and may be adjusted according to practical demand.

For positioning the light-emitting structure 10A and the carrying substrate 200 to perform the assembly, the light-emitting structure 10A includes a first positioning mark 110, and the carrying substrate 200 includes a second positioning mark 210 for subsequent positioning. According to some embodiments, the first positioning mark 110 may be disposed on the substrate 100. Alternatively, according to some embodiments, the first positioning mark 110 may be disposed in the substrate 100. Alternatively, according to some embodiments, the first positioning mark 110 may be disposed on the circuit board 140. Alternatively, according to some embodiments, the first positioning mark 110 may be disposed in the circuit board 140.

First, referring to FIG. 1A, an image of the light-emitting structure 10A can be taken from below by a camera device 300 to capture an image of the first positioning mark 110 and to record the position in a horizontal plane (the X-Y plane). The first positioning mark 110 may be metal, color photoresist, a semiconductor layer, etc., but the first positioning marks 110 are not limited thereto. The second positioning mark 210 may be metal, color photoresist, a semiconductor layer, etc., but are not limited thereto. Subsequently, the assembly and positioning of the light-emitting module 20A are performed based on the position of the first positioning mark 110. Although the present embodiment is illustrated as having two first positioning marks 110 and two second positioning marks 210, the number of first positioning marks 110 and the number of second positioning marks 210 are not limited thereto, and may be adjusted according to practical demand. In some embodiments, a plurality of the first positioning marks and a plurality of the second positioning marks can be disposed.

Next, as shown in FIG. 1B, the carrying substrate 200 is provided and disposed on a movable carrying platform 220. For example, in the present embodiment, the material of the carrying substrate 200 can be metallic material (such as aluminum), glass, or plastic material (such as polyethylene terephthalate (PET)), it is not limited thereto. For positioning the carrying substrate 200 and the light-emitting structure 10A to perform the assembly, two second positioning marks 210 are disposed on the carrying substrate 200. An image of the carrying substrate 200 is captured, and the positions of the second positioning marks 210 are recorded. Then, the carrying platform 220 is moved along the horizontal plane (the X-Y plane) according to the positions of the second positioning marks 210, making the images of the first positioning marks 110 and the second positioning marks 210 overlap along a vertical direction (the Z-axis direction). That is, in a top view, the first positioning marks 110 and the second positioning marks 210 overlap. Therefore, the alignment of the light-emitting structure 10A with the carrying substrate 200 is completed, and the light-emitting structure 10A is fixed on the carrying substrate 200 along the vertical direction. Regarding the method for determining whether the first positioning marks and the second positioning marks overlap, it will be discussed in further detail in connection with FIGS. 3A-3E. In addition, the bonding layer 130 may be disposed on the carrying substrate 200 for bonding the light-emitting structure 10A to the carrying substrate 200, wherein the bonding layer 130 is an adhesive or any other sticky material, but the bonding layer 130 is not limited thereto. As shown in FIG. 1B, the substrate 100 has a first surface 101 and a second surface 102, and the plurality of light-emitting elements 120 are disposed on the first surface 101.

As shown in FIG. 1C, after determining that the first positioning marks 110 and the second positioning marks 210 overlap, the light-emitting structure 10A is disposed on the bonding layer 130 such that the light-emitting structure 10A is combined onto the carrying substrate 200, and the assembly of the light-emitting module 20A is complete. The bonding layer 130 is adhered between the second surface 102 and the carrying substrate 200. By arranging the carrying substrate 200, the thermal-dissipation or buffer effect of the light-emitting module 20A may be enhanced, or the flatness of the light-emitting module 20A may be increased.

Furthermore, in some other embodiments, the first positioning mark can comprise a hole, a penetrating hole, a blind hole, a protrusion, a concave part, a pattern, a screw, a screw hole, or combinations thereof, and can be disposed on or in the substrate 100. Similarly, in some embodiments, the second positioning mark can comprise a hole, a penetrating hole, a blind hole, a protrusion, a concave part, a pattern, a screw, a screw hole, or combinations thereof, and can be disposed on or in the carrying substrate 200. The camera device 300 is utilized in the aforementioned manner to aid in the alignment of the light-emitting structure 10A with the carrying substrate 200.

Figure 2A:
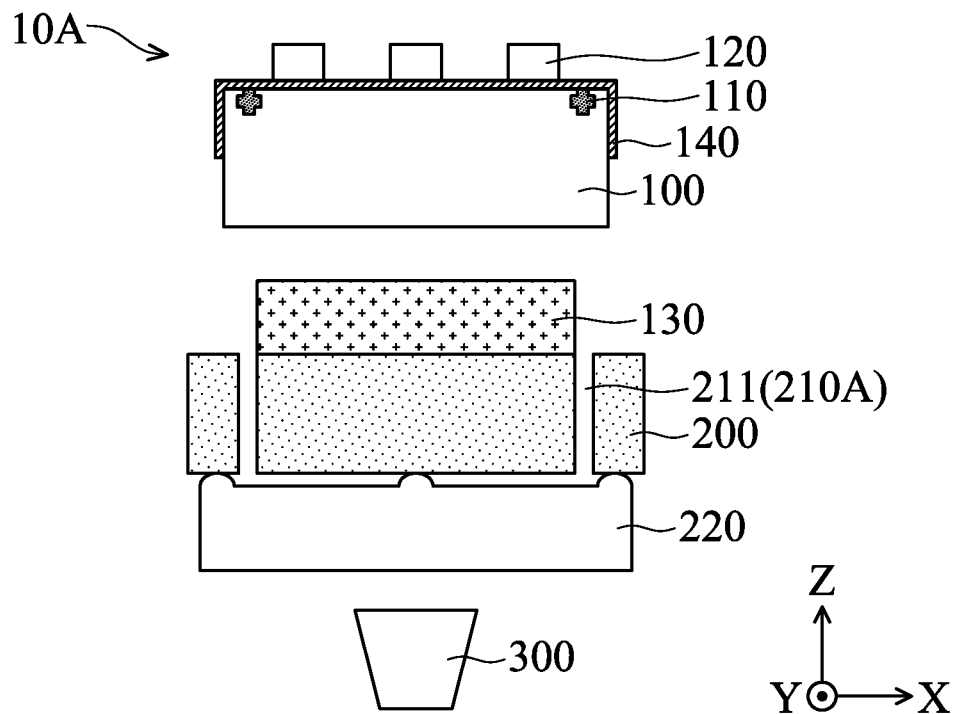
FIGS. 2A-2B are cross-sectional views illustrating the assembly process of the light-emitting module in accordance with some embodiments of the present disclosure.
Figure 2B:
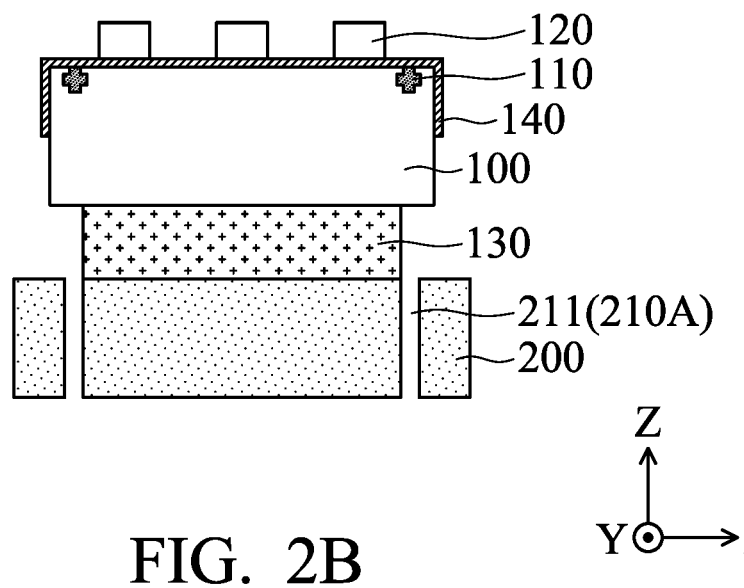

Next, referring to FIG. 2A, FIG. 2A is a cross-sectional view illustrating the assembly process of the light-emitting module in accordance with some embodiments of the present disclosure. It should be noted that the light-emitting module 20B in the present embodiment may include the same or similar portions as the light-emitting module 20A shown in FIGS. 1A-1C. Those portions that are the same or similar will be labeled with similar numerals, and will not be discussed in detail again. The difference between the light-emitting module 20B in the present embodiment and the light-emitting module 20A shown in FIGS. 1A-1C is that second holes 211 are formed in and penetrate the carrying substrate 200. The second holes 211 may serve as the second positioning marks 210A. As such, the camera device 300 may capture the image of the first positioning marks 110 through the second holes 211, and record the positions of the first positioning marks 110 in the horizontal plane (the X-Y plane). As shown in FIG. 2B, after determining that the first positioning mark 110 and the second hole 211 (the second positioning marks 210A) overlap in the vertical direction (the Z-axis direction), the light-emitting structure 10A is disposed on the bonding layer 130 such that the light-emitting structure 10A is fixed on the carrying substrate 200. By arranging the second holes 211, the positioning and the assembly of the light-emitting structure 10A and the carrying substrate 200 may be completed in a single step, saving time or related cost in the process. In addition, in some embodiments, the second holes 211 may be provided for the passage of signal lines (not shown), which are configured to transmit electrical signals to the light-emitting elements 120.

It should be noted that in some embodiments, the shape of the second holes 211 may be, for example, circle, oval, triangle, rectangle, hexagon, polygon, irregular shape, or any shape. According to some embodiments, a shape of the first positioning mark 110 may be substantially the same as or similar to a shape of the second positioning mark 211. It is beneficial to determine whether the first positioning mark 110 and the second positioning mark (for example, the second hole 211) overlap or not. Regarding the method for determining whether the first positioning mark and the second positioning mark overlap, it will be discussed in further detail in connection with FIGS. 3A-3E.

Referring to FIGS. 3A-3E, FIGS. 3A-3E are plan views illustrating the alignment of the first positioning mark with the second positioning mark. It should be noted that the first positioning mark and the second positioning mark described in the present embodiment may include any kind of positioning structure mentioned in the embodiments of the present disclosure. In addition, in FIGS. 3A-3E, the first positioning mark and the second positioning mark are viewed from the vertical direction (the Z-axis direction), that is, viewed from a top view. The term "area" mentioned in reference with FIGS. 3A-3E means the areas of the positioning marks in the horizontal plane (the X-Y plane), which are viewed via the camera device 300.

Figure 3A:
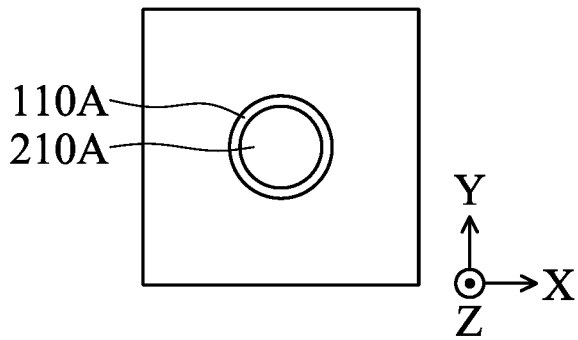
FIGS. 3A-3E are plan views illustrating the alignment of first positioning marks with second positioning marks.

As shown in FIG. 3A, in the present embodiment, a first positioning mark 110A and a second positioning mark 210A are disposed, and both of the first positioning mark 110A and the second positioning mark 210A are circular, wherein the size of the first positioning mark 110A is greater than the size of the second positioning mark 210A. In some other embodiments, the size of the first positioning mark 110A may be substantially equal to or smaller than the size of the second positioning mark 210A. When the areas of the first positioning mark 110A and the second positioning mark 210A completely overlap, the first positioning mark 110A and the second positioning mark 210A may be determined to be aligned, and the subsequent operation for bonding the light-emitting structure 10A onto the carrying substrate 200 may be performed.

Figure 3B:
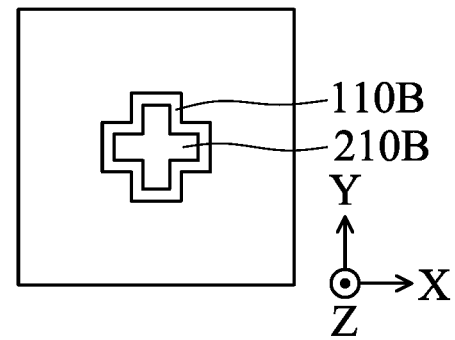

As shown in FIG. 3B, in the present embodiment, a first positioning mark 110B and a second positioning mark 210B are also disposed, and both of the positioning marks are criss-cross patterns. Similarly, the size of the first positioning mark 110B may be greater than, substantially equal to, or smaller than the size of the second positioning mark 210B. When the areas of the first positioning mark 110B and the second positioning mark 210B completely overlap, the first positioning mark 110B and the second positioning mark 210B may be determined to be aligned, and the subsequent operation for bonding the light-emitting structure 10A to the carrying substrate 200 may be performed.

Figure 3C:
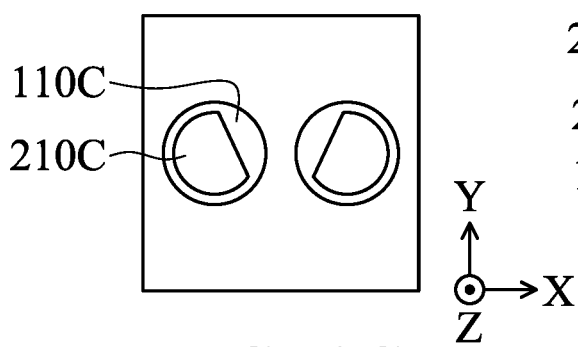

In addition, besides the aforementioned embodiments where single first positioning mark and/or second positioning mark is disposed, a plurality of first positioning marks and/or second positioning marks may also be disposed. As shown in FIG. 3C, in the present embodiment, two first positioning marks 110C and two second positioning marks 210C are disposed, and the area of the first positioning marks 110C is greater than the area of the second positioning marks 210C, wherein the first positioning marks 110C are circular, and the second positioning marks 210C are circular segments. According to some embodiments, the value of the overlapping area of the first positioning mark 110C and the second positioning mark 210C may be greater than or equal to the value of the area of the first positioning mark 110C divided by the number of first positioning marks 110C. For example, as shown in FIG. 3C, two first positioning marks 110C are disposed, and the area of the second positioning mark 210C may be greater than or equal to half of the area of the first positioning mark 110C.

Figure 3D:
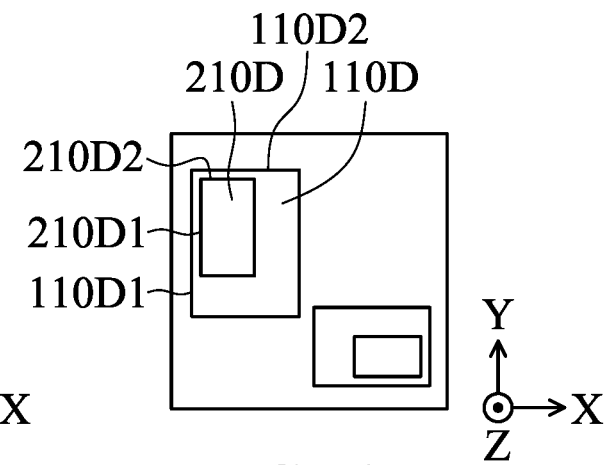

As shown in FIG. 3D, in the present embodiment, two rectangular first positioning marks 110D and two second positioning marks 210D are disposed, wherein the size of the second positioning marks 210D is smaller than the size of the first positioning marks 110D. Each of the first positioning marks 110D includes two first positioning edges 110D1 and 110D2, and each of the second positioning marks 210D includes two second positioning edges 210D1 and 210D2. The first positioning marks 110D and the second positioning marks 210D are positioned by aligning the second positioning edges 210D1 and 210D2 of the second positioning marks 210D with the respective first positioning edges 110D1 and 110D2 of the first positioning marks 110D.

Figure 3E:
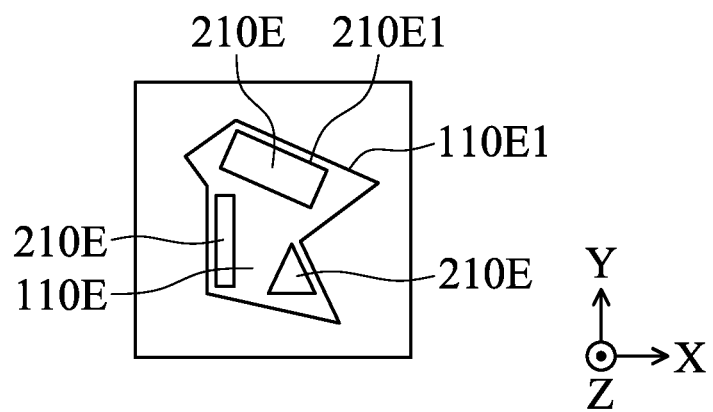

As shown in FIG. 3E, in the present embodiment, an irregular polygonal first positioning mark 110E and three second positioning marks 210E with different shapes are disposed, and the positions of the second positioning marks 210E are located in the region of the first positioning mark 110E. The second positioning marks 210E and the first positioning mark 110E are positioned by aligning the second positioning edge 210E1 of one of the second positioning marks 210E with the first positioning edge 110E1 of the first positioning mark 110E.

According to some embodiments, the number of first positioning edges may be greater than or equal to the total number of edges of the first positioning mark divided by the number of first positioning edges used for positioning. In terms of the embodiment shown in FIG. 3D, the first positioning mark 110D is a rectangle with four edges, and two first positioning marks 110D are disposed in the present embodiment, therefore, the first positioning mark 110D may be positioned by at least two edges (namely, the first positioning edges 110D1 and 110D2) therein.

It should be noted that the first positioning marks serve as an example to discuss the relationship between the area of positioning marks and the number of positioning edges therein in the foregoing paragraphs. However, those skilled in the art will realize that in the aforementioned embodiments, the relationship between the positioning marks regarding sizes, positions, etc. may be interchangeably applied to the first positioning marks and the second positioning marks. In other words, the relationship between the areas of the first positioning marks and the number of positioning edges may be applied to the second positioning marks. For the simplicity of the specification, it will not be repeated in the following description again.

Figure 4A:
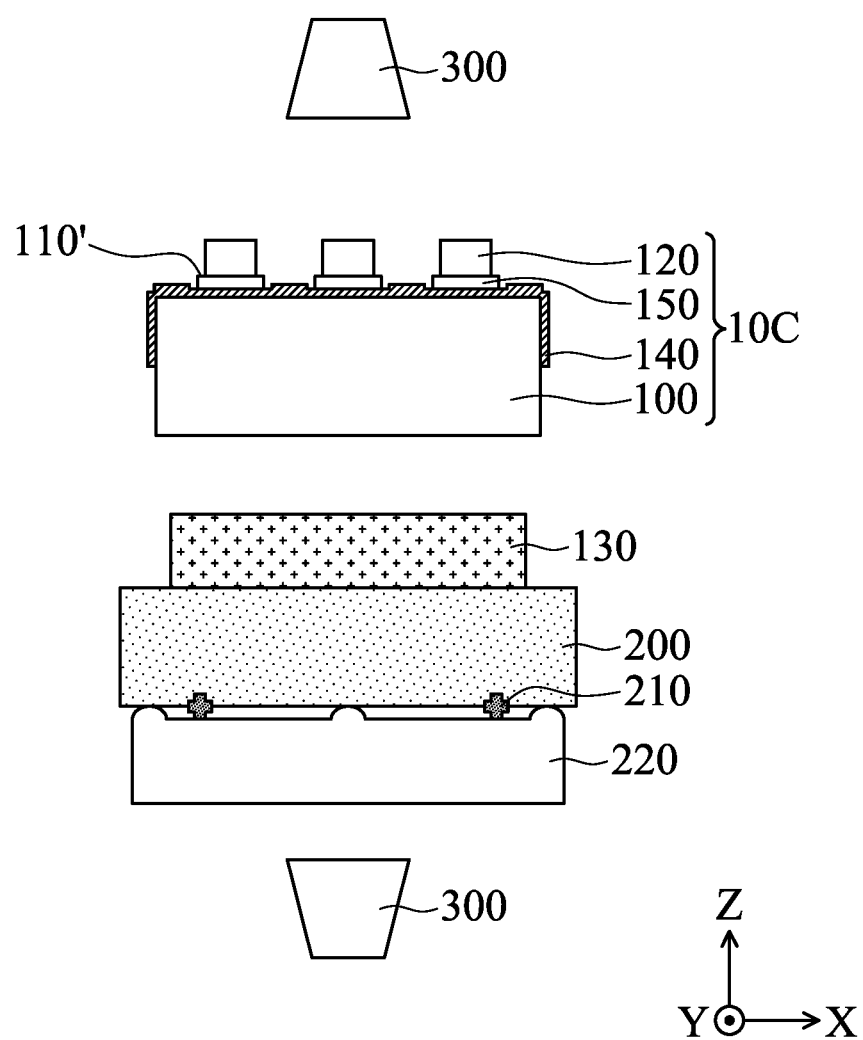
FIGS. 4A-4B are cross-sectional views illustrating the assembly process of the light-emitting module in accordance with some embodiments of the present disclosure.
Figure 4B:
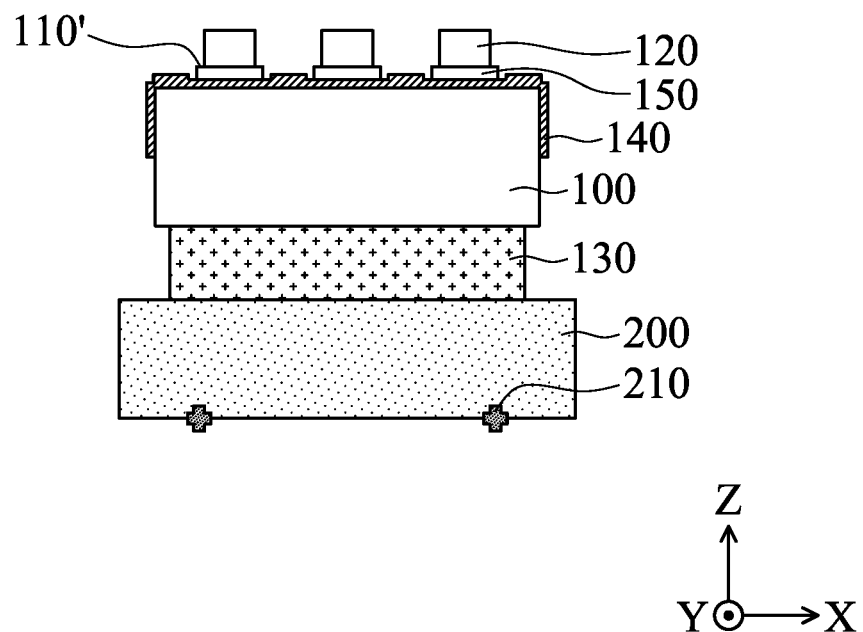

Next, referring to FIGS. 4A-4B, FIGS. 4A-4B are cross-sectional views illustrating the assembly process of the light-emitting module 20C in accordance with some embodiments of the present disclosure. It should be noted that the light-emitting module 20C in the present embodiment may include the same or similar portions as the light-emitting module 20A shown in FIGS. 1A-1C. Those portions that are the same or similar will be labeled with similar numerals, and will not be discussed in detail again. The difference between the light-emitting module 20C in the present embodiment and the light-emitting module 20A shown in FIGS. 1A-1C is that the solder pads 150 are disposed on the circuit board 140 for bonding the light-emitting elements 120. The solder pads 150 shown in FIG. 4A are only roughly illustrated. A solder material 151 (shown in FIGS. 5B-5D) will be formed on the solder pad 150 for making the light-emitting element 120 electrically connected to the circuit board 140 via the solder pad 150. Regarding the process of forming the solder material 151, it will be discussed in further detail in connection with FIGS. 5A-5D. As shown in FIG. 4A, the size of the solder pad 150 is greater than the size of the light-emitting element 120, such that the light-emitting element 120 may cover a portion of the solder pad 150, and expose another portion 110' of the solder pad 150. The exposed portion 110' may serve as a first positioning mark of the light-emitting structure 10C. In addition, in some other embodiments, the solder pads 150 may have different heights (namely, the position of the solder pads 150 in Z-axis direction). The solder pads 150 with different heights may serve as the first positioning marks of the light-emitting structure 10C for subsequent positioning with the carrying substrate 200.

As shown in FIG. 4A, the images and positions of the first positioning mark 110' and the second positioning mark 210 may be captured simultaneously by two camera devices 300. The first positioning mark can include the exposed portion 110' of the solder pads 150, which is not covered by the light-emitting elements 120. The carrying platform 220 is moved for overlapping the first positioning marks and the second positioning marks in the vertical direction (the Z-axis direction), and thereby the light-emitting structure 10C and the carrying substrate 200 are positioned. After determining that the exposed portion 110' (the first positioning marks) and the second positioning marks 210 overlap in the vertical direction (the Z-axis direction), the light-emitting structure 10C is disposed on the bonding layer 130 such that the light-emitting structure 10C is fixed on the carrying substrate 200, assembled as the light-emitting module 20C.

Figure 5A:
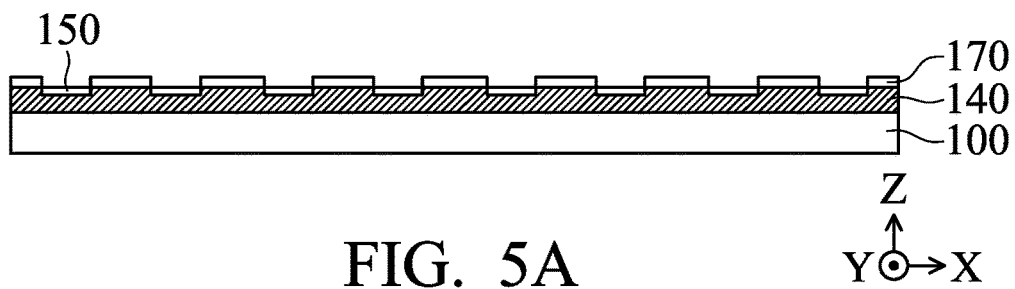
FIGS. 5A-5D are cross-sectional views illustrating the course of arranging light-emitting elements on a light-emitting structure.
Figure 5B:
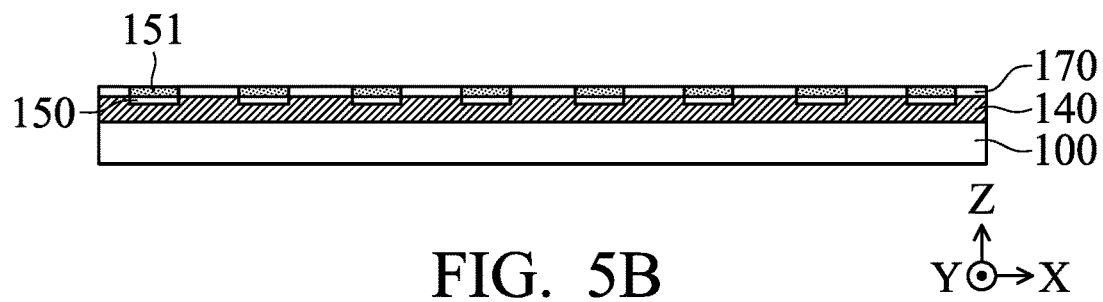
Figure 5C:
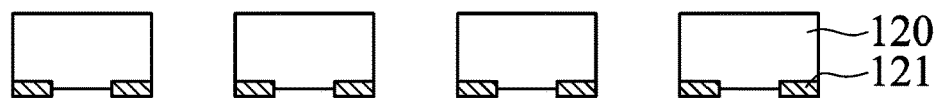
Figure 5C:
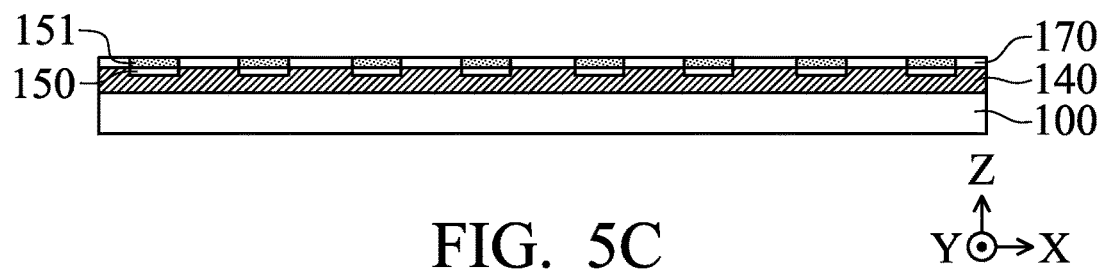

Referring to FIGS. 5A-5D, FIGS. 5A-5D are cross-sectional views illustrating the process of arranging light-emitting elements 120 on the substrate 100. First, as shown in FIG. 5A, a shielding layer 170 is formed on the circuit board 140, and the shielding layer 170 may expose the positions of the solder pads 150 formed in the circuit board 140. For example, the shielding layer 170 may be an organic material or an insulating material, but the shielding layer 170 is not limited thereto. Then, the solder material 151 is filled into gaps between the shielding layer 170. The solder material, for example, can include tin (that is the solder material 151 is, for example, an alloy including tin), but the solder material 151 is not limited thereto. By arranging the shielding layer 170, the arrangement of the solder material 151 may be controlled more precisely, such that the solder material 151 may be disposed flat over the solder pads 150, instead of overflowing out of the region of the solder pads 150. In other words, as viewed in the vertical direction (the Z-axis direction), the area of the region filled with the solder material 151 may be substantially equal to the area of the solder pads 150.

Figure 5D:
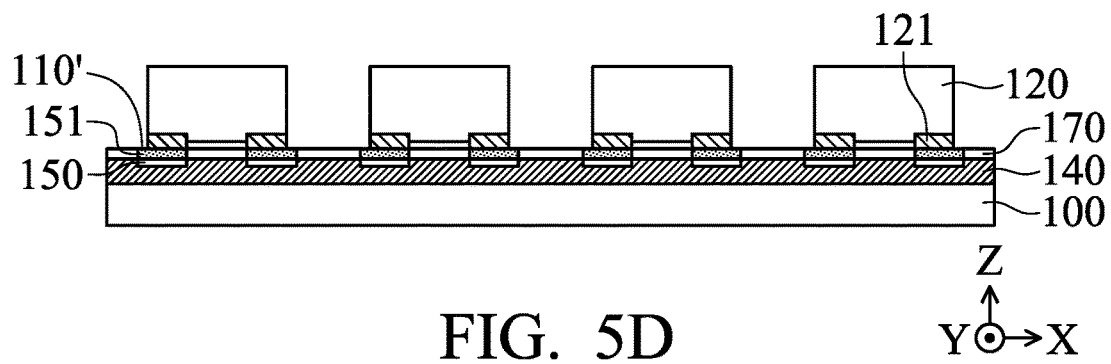

After filling the solder material 151, the light-emitting elements 120 are disposed on the solder pads 150 (namely, on the region filled with the solder material 151), such that the contacts 121 of the light-emitting elements 120 are directly bonded to the solder material 151. As shown in FIG. 5D, there is the exposed portion 110' uncovered by and exposed by the light-emitting elements 120 on the solder pads 150, and the exposed portion 110' can serve as the first positioning mark for subsequent positioning.

Figure 5E:
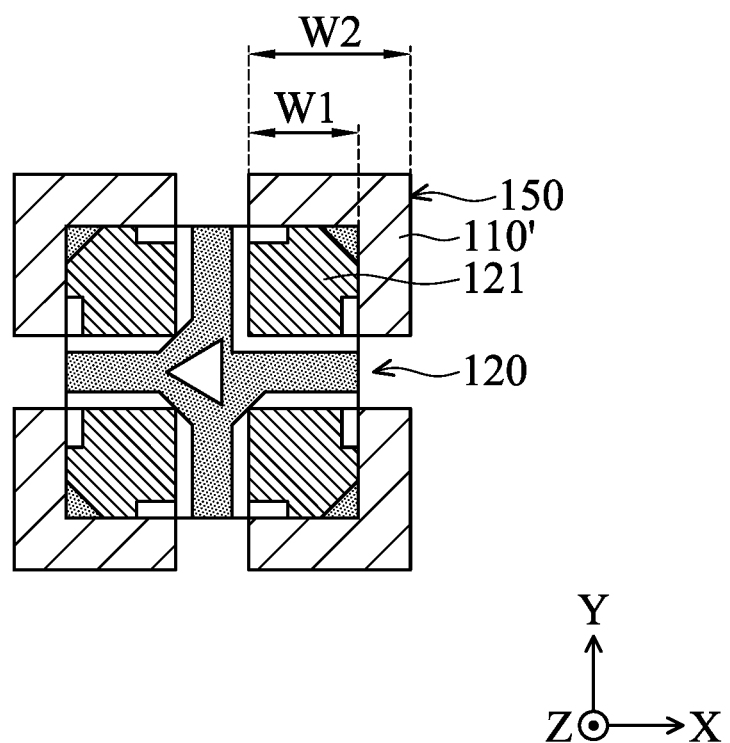
FIG. 5E is a plan view illustrating contacts between solder pads and the light-emitting elements.

Referring to FIG. 5E, FIG. 5E is a plan view illustrating the contacts 121 of the light-emitting elements 120 and the solder pads 150. It should be noted that for clearly presenting the dimensional relationship between the solder pads 150 and the light-emitting elements 120, the solder material 151 disposed on the solder pads 150 is not illustrated in the present figure. As shown in FIG. 5E, the light-emitting elements 120 include four contacts 121 bonded on four respective solder pads 150. One of the contacts has the first width W1, and the solder pad 150 corresponding to the contact 121 has the second width W2. The rest of the three contacts and the three solder pads may have the same or similar width relationship. The second width W2 may be greater than the first width W1. For example, the first width W1 is in a range between about 0.2 mm and about 0.4 mm, the second width W2 is in a range between about 0.35 mm and about 0.55 mm, but the first width W1 and the second width W2 are not limited thereto.

Figure 6A:
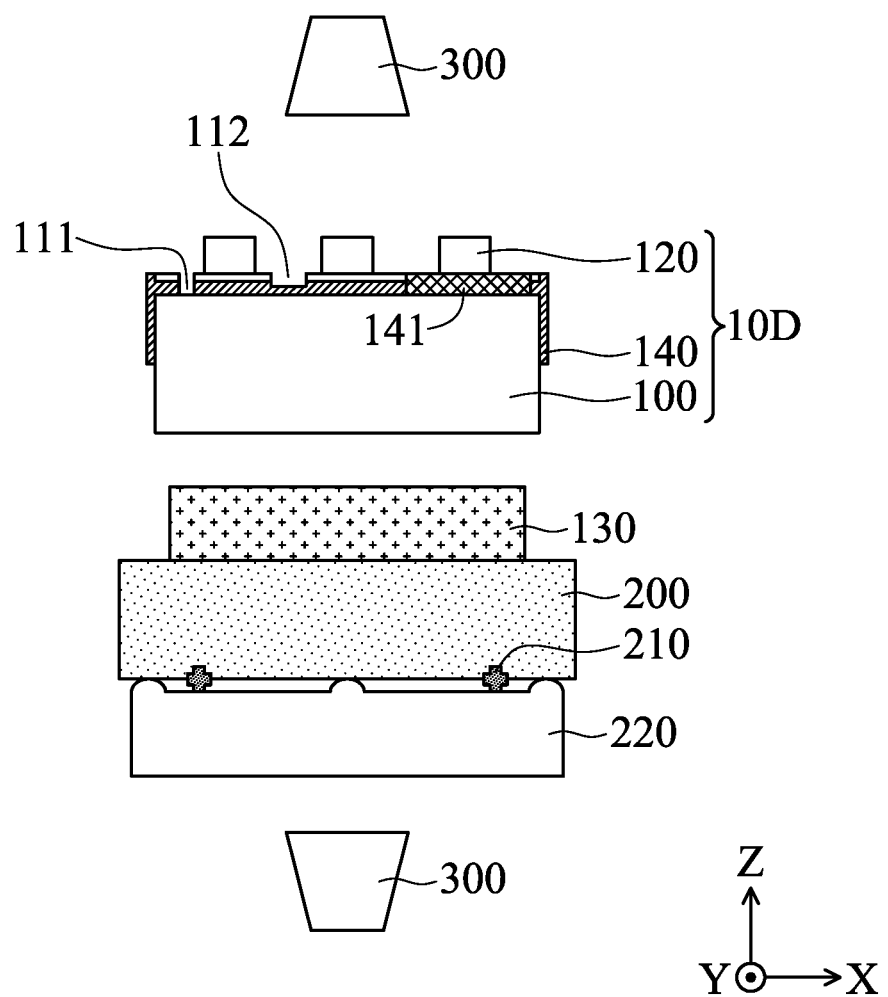
FIGS. 6A-6B are cross-sectional views illustrating the assembly process of the light-emitting module in accordance with some embodiments of the present disclosure.
Figure 6B:
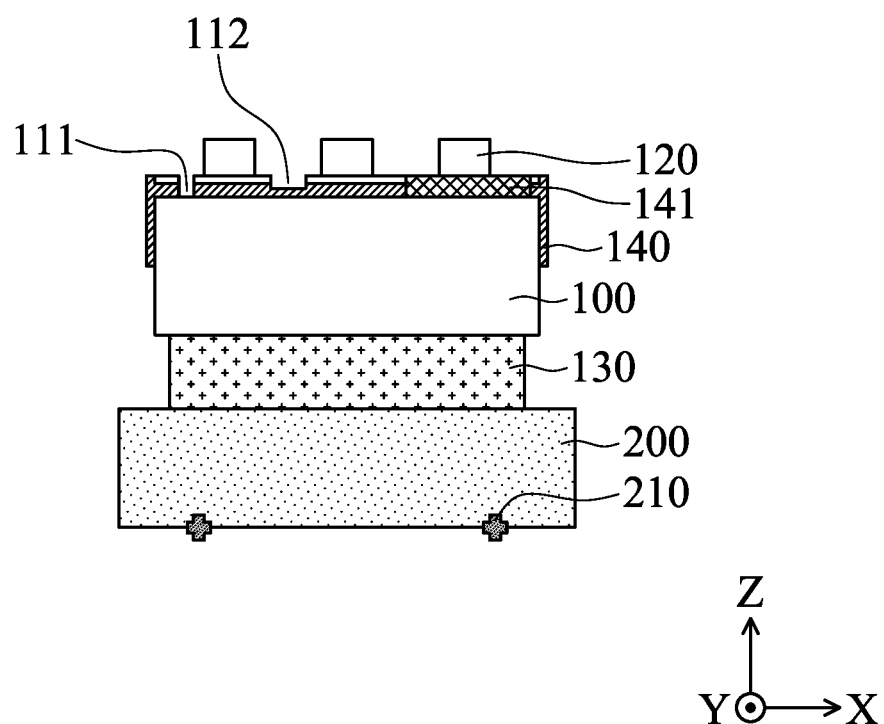

Referring to FIGS. 6A-6B, FIGS. 6A-6B are cross-sectional views illustrating the assembly process of the light-emitting module 20D in accordance with some embodiments of the present disclosure. It should be noted that the light-emitting module 20D in the present embodiment may include the same or similar portions as the light-emitting module 20A shown in FIGS. 1A-1C. Those portions that are the same or similar will be labeled with similar numerals, and will not be discussed in detail again. The difference between the light-emitting module 20D in the present embodiment and the light-emitting module 20A shown in FIGS. 1A-1C is that in the present embodiment, a first hole 111 may be formed in the light-emitting structure 10D. Specifically, the first hole 111 may be formed in and penetrate the circuit board 140. On the other hand, a first hole 112 may be formed in the circuit board 140, but does not penetrate the circuit board 140. In addition, a special colored region 141 may be formed on the substrate 100 or on the circuit board 140. The colored region 141 may have different color, pattern, or text from other portions of the circuit board 140. The first holes 111, 112 and/or the colored region 141 may serve as the first positioning marks of the substrate 100, configured to align with the second positioning marks 210 (such as metal marks). Although the first holes 111, 112 and the colored region 141 are illustrated in the present embodiment at the same time, in some other embodiments, one or any two of the first holes 111, 112 and the colored region 141 may also be disposed.

As shown in FIGS. 6A-6B, the image and position of the first positioning mark (such as the first hole 111) and the second positioning mark 210 (such as metal marks) may be captured simultaneously by two camera devices 300. The carrying platform 220 is moved such that the first positioning mark and the corresponding second positioning mark can be aligned in the vertical direction (the Z-axis direction), and thereby the light-emitting structure 10D and the carrying substrate 200 are aligned and positioned. After determining that the first positioning mark (such as the first holes 111) and the second positioning mark 210 (such as metal mark) overlap in the vertical direction (the Z-axis direction), the light-emitting structure 10D is disposed on the bonding layer 130 such that the light-emitting structure 10D is fixed to the carrying substrate 200 via the bonding layer 130, and the assembly of the light-emitting module 20D is complete.

Referring to FIG. 7A, FIG. 7A is a cross-sectional view illustrating a display device 700A in accordance with some embodiments of the present disclosure. As shown in FIG. 7A, a plurality of light-emitting modules 20E may be disposed in a cabinet 400, combined as the display device 700A. The display device 700A may be a tiled display device. It should be noted that the light-emitting modules 20E in the present embodiment may include the same or similar portions as the light-emitting module 20A shown in FIGS. 1A-1C. Those portions that are the same or similar will be labeled with similar numerals, and will not be discussed in detail again. The difference between the light-emitting module 20E in the present embodiment and the light-emitting module 20A shown in FIGS. 1A-1C is that a part of the circuit board 140 may extend below the substrate 100 through a sidewall of the substrate 100 to form a lower part, and an electrical component 190 is disposed on the lower part of the circuit board 140. At least one of the light-emitting modules 20E may include a light-emitting structure 71 and the carrying substrate 200. The light-emitting structure 71 may include a plurality of light-emitting elements 120. Similarly to the aforementioned embodiments, the light-emitting structure 71 may include a first positioning mark 110, the carrying substrate 200 may include a second positioning mark 210, and the first positioning mark 110 and the second positioning mark 210 may overlap in the vertical direction (Z direction) for positioning, in a manner similar to the above embodiments. The electrical component 190 may be an integrated circuit (IC) component, a resistor, an inductor, etc., but the electrical component 190 is not limited thereto. In other embodiments, the electrical component 190 may be any suitable electronic component as required. The light-emitting elements 120 may be light-emitting diodes (LED), such as micro-LED or mini-LED. As such, the display device 700A is a tiled LED display device.

An optical layer, such as a light-shielding layer 180A, may be disposed on the circuit board 140 and between the light-emitting elements 120. The reflectivity of the light-shielding layer 180A may be between 0% and 10%. For example, the material of the light-shielding layer 180A may be photoresist, silicon, organic materials, paint, carbon nanotube, or polymers. Examples for the polymers may be polycarbonate (PC), polyurethane (PU), polymethyl methacrylate (PMMA), epoxy resin, etc., but the polymers are not limited thereto. In some other embodiments, the light-shielding layer 180A may be any dark or black material with a reflectivity between 0% and 10%, such as black photoresist.

For the sake of the convenience of description, the display device 700A in FIG. 7A merely shows the first positioning mark 110 and the second positioning mark 210, which are of the same shape or pattern as that in FIG. 1B. However, according to other embodiments, the first positioning mark and the second positioning mark may also be of other shapes or patterns, and may also be substituted with other types of positioning marks described in the present disclosure, and will not be repeated again.

Referring to FIG. 7B, FIG. 7B is a cross-sectional view illustrating the display device 700B in accordance with some embodiments of the present disclosure. As shown in FIG. 7B, the display device 700B may include a display panel 70 and a light-emitting module 20F. The light-emitting module 20F can provide a light source for the display panel 70. The light-emitting modules 20F may be backlight modules. Although the present embodiment is illustrated as having four light-emitting modules 20F, a different number of light-emitting modules 20F may be disposed in other embodiments. For example, one or more light-emitting modules 20F may provide a light source for the display panel 70. The display device 700B can include a plurality of light-emitting modules 20F to provide the light source. The display panel 70, for example, may be a liquid-crystal display panel, but the display panel 70 is not limited thereto. It should be noted that the light-emitting modules 20F in the present embodiment may include the same or similar portions as the light-emitting modules 20E shown in FIG. 7A. Those portions that are the same or similar will be labeled with similar numerals, and will not be discussed in detail again. At least one of the light-emitting modules 20F may include a light-emitting structure 72 and the carrying substrate 200. The light-emitting structure 72 may include a plurality of light-emitting elements 120. The difference between the light-emitting modules 20F in the present embodiment and the light-emitting modules 20E shown in FIG. 7A is that different types of the first positioning marks and the second positioning marks may be utilized. A second hole 211 is formed in the carrying substrate 200, and serves as a second positioning mark. The electrical component 190 may serve as a first positioning mark of the light-emitting structure 72. The electrical component 190 (the first positioning mark) and the second hole 211 (the second positioning mark) can overlap in the vertical direction, such that the light-emitting structure 72 may be fixed on the carrying substrate 200 along the vertical direction. In other words, as viewed in the vertical direction (the Z-axis direction), the electrical component 190 and the second hole 211 overlap. In addition, an optical layer may be disposed on the circuit board 140 and between the light-emitting elements 120, such as a light-shielding layer 180A or a reflective layer 180B.

For the sake of the convenience of description, the electrical component 190 and the second hole 211, which respectively serve as the first positioning mark and the second positioning mark, are shown in the display device 700B of FIG. 7B. However, according to other embodiments, the first positioning mark and the second positioning mark may also be replaced by other types of positioning marks as described in the present disclosure, and will not be repeated again.

Figure 7C:
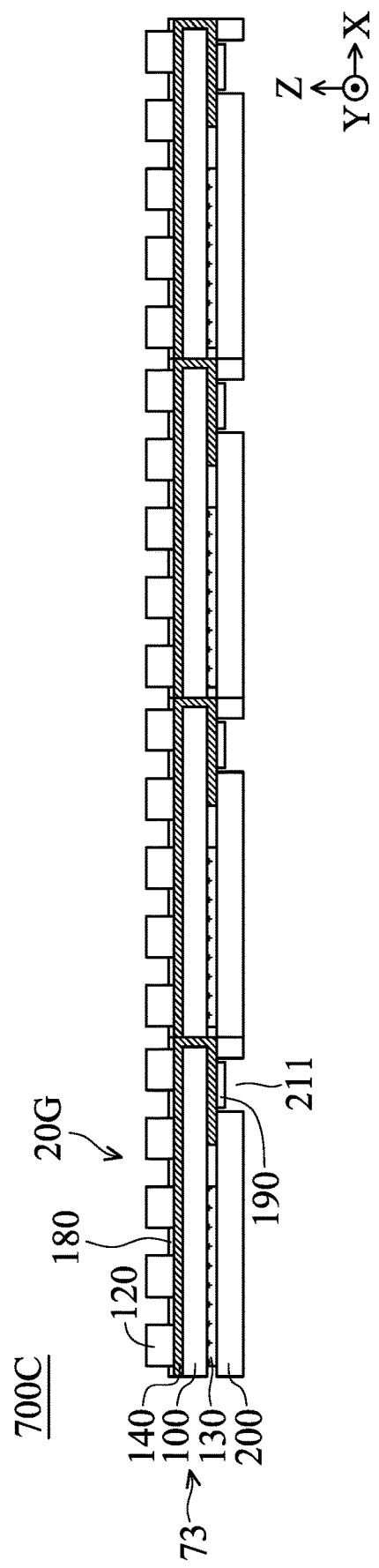

Referring to FIG. 7C, FIG. 7C is a cross-sectional view illustrating the display device 700C in accordance with some embodiments of the present disclosure. As shown in FIG. 7C, a plurality of light-emitting modules 20G may be combined to form the display device 700C. The light-emitting modules 20G in the present embodiment may include the same or similar portions as the light-emitting modules 20F shown in FIG. 7B. Those portions that are the same or similar will be labeled with similar numerals, and will not be discussed in detail again. At least one of the light-emitting modules 20G may include a light-emitting structure 73 and the carrying substrate 200. The light-emitting structure 73 may include a plurality of light-emitting elements 120. The difference between the light-emitting modules 20G in the present embodiment and the light-emitting modules 20F shown in FIG. 7B is that the electrical component 190 is disposed in the second holes 211 of the carrying substrate 200. Therefore, the accuracy of positioning may be further enhanced, or the thickness of the bonding layer 130 may be reduced, such that the overall thickness of the display device 700C may be reduced. According to some embodiments, the plurality of light-emitting modules 20G may be disposed in the cabinet and constitute a tiled display device in the manner shown in FIG. 7A. According to some embodiments, the light-emitting modules 20G may be combined with the display panel and constitute a display device in the manner shown in FIG. 7B, which will not be repeated again.

Figure 8:
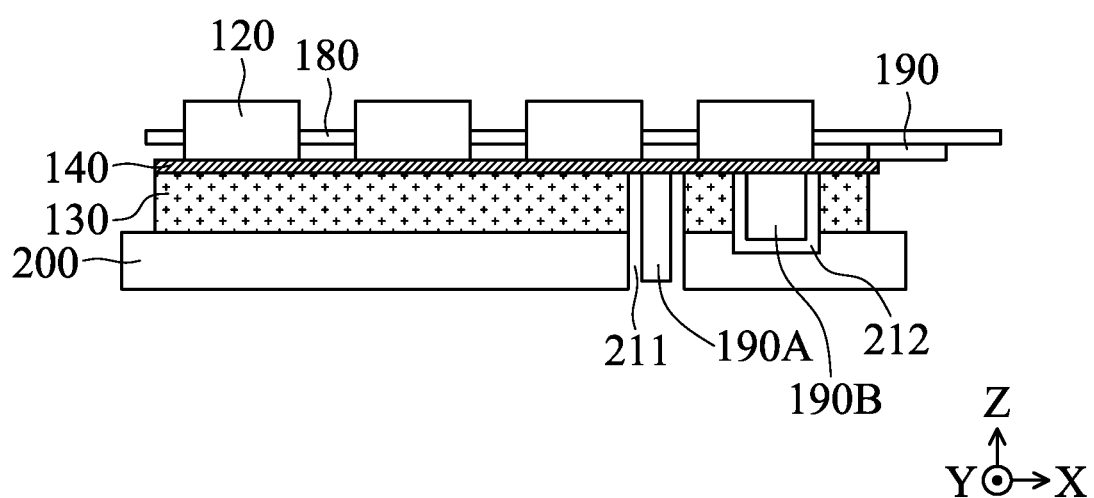
FIG. 8 is a cross-sectional view illustrating the light-emitting module in accordance with some embodiments of the present disclosure.

Referring to FIG. 8, FIG. 8 is a cross-sectional view illustrating the light-emitting module 20H in accordance with some embodiments of the present disclosure. It should be noted that the light-emitting module 20H in the present embodiment may include the same or similar portions as the light-emitting modules 20G shown in FIG. 7C. Those portions that are the same or similar will be labeled with similar numerals, and will not be discussed in detail again. The difference between the light-emitting module 20H in the present embodiment and the light-emitting modules 20G shown in FIG. 7C is that the substrate 100 is omitted in the present embodiment, and electrical components 190A, 190B may be disposed on the surface, which faces the carrying substrate 200, of the circuit board 140. That is, the circuit board 140 is in contact with the bonding layer 130. For example, the electrical components 190A and 190B may be an integrated circuit (IC) component, resistor, inductor, etc., but the electrical components 190A and 190B are not limited thereto. The second hole 211 is formed on the carrying substrate 200, and may penetrate the bonding layer 130 and the carrying substrate 200 simultaneously. Another second hole 212 is formed on the carrying substrate 200, the second hole 212 may penetrate the bonding layer 130, but does not penetrate the carrying substrate 200. In the present embodiment, the electrical components 190A, 190B (the first positioning marks) are disposed to align with the second holes 211, 212 (the second positioning marks) respectively, and thereby the effect of precisely positioning is achieved. In the present embodiment, the substrate 100 is omitted in the present embodiment, the circuit board 140 is aligned with the carrying substrate 200, and bonded to the carrying substrate 200 via the bonding layer 130. Since the thickness of the substrate 100 is reduced, the overall thickness of the light-emitting module may also be reduced.

In addition, according to some embodiments, the above-mentioned light-emitting module can be adjusted such that the substrate 100 can be retained, but the circuit board 140 can be omitted. Metal lines (not shown) are disposed on the substrate 100 in these embodiments, and the metal lines are configured to transmit electrical signals to the light-emitting elements 120. Since the substrate 100 generally is made of material with a higher flatness (such as glass, but it is not limited thereto), this will increase the flatness of the light-emitting module, such that the yield of arranging elements on the substrate 100 may also be increased.

As described above, according to some embodiments of the present disclosure, the light-emitting module includes positioning marks. Thus, when the light-emitting structure is assembled onto the carrying substrate, positioning procedure can be performed precisely. Therefore, the time or related cost required for the process may be reduced.

It should be noted that the aforementioned sizes, parameters and shapes of the elements are not limitations of the present disclosure. Those skilled in the art may adjust these settings according to different needs. Moreover, the display devices and the light-emitting modules are not limited to the configurations shown in FIGS. 1A-8. Some embodiments of the present disclosure may just include any one or more features of any one or more embodiments of FIGS. 1A-8. That is to say, according to some other embodiments, there is no need that the display device and the light-emitting module include all the features in the drawings of the above-mentioned embodiments.

While the disclosure has been described in terms of embodiments and their advantages, it is to be understood that those skilled in the art may make various changes, substitutions, and alterations to the disclosure without departing from the spirit and scope of the present disclosure. In addition, the scope of the present disclosure is not limited to the process, machines, manufacture, composition, devices, methods and steps in the specific embodiments described in the specification. Those skilled in the art will understand that existing or developing processes, machines, manufacture, composition, devices, methods, and steps may be performed in the aforementioned embodiments, as long as they can obtain substantially the same result, in accordance with some embodiments of the present disclosure. Therefore, the scope of the present disclosure includes the aforementioned processes, machines, manufacture, composition, devices, methods and steps. Furthermore, each of the appended claims constructs an individual embodiment, and the scope of the present disclosure also includes every combination of the appended claims and embodiments.

What is claimed is:

1. A light-emitting module, comprising:
a light-emitting structure comprising a plurality of light-emitting elements, a circuit board, a solder pad, and a first positioning mark, wherein at least one of the plurality of light-emitting elements is electrically connected to the circuit board via the solder pad; and
a carrying substrate comprising a second positioning mark,
wherein the light-emitting structure is fixed on the carrying substrate along a direction, and the first positioning mark and the second positioning mark overlap in the direction and are not covered by the plurality of light-emitting elements, and wherein the first positioning mark is disposed in the circuit board, or the first positioning mark comprises a portion of the solder pad.

2. The light-emitting module as claimed in claim 1, wherein the first positioning mark comprises a metal mark.

3. The light-emitting module as claimed in claim 1, wherein the light-emitting structure further comprises a substrate and the circuit board is disposed on the substrate, a first hole is formed in the circuit board, and the first positioning mark comprises the first hole.

4. The light-emitting module as claimed in claim 1, wherein the at least one of the plurality of light-emitting elements covers a portion of the solder pad and exposes another portion of the solder pad, and the first positioning mark comprises the exposed another portion of the solder pad.

5. The light-emitting module as claimed in claim 4, wherein the light-emitting structure further comprises a solder material disposed between the solder pad and the at least one of the plurality of light emitting elements.

6. The light-emitting module as claimed in claim 1, wherein the second positioning mark comprises a metal mark.

7. The light-emitting module as claimed in claim 1, wherein a second hole is formed in the carrying substrate, and the second positioning mark comprises the second hole.

8. The light-emitting module as claimed in claim 7, wherein the second hole penetrates the carrying substrate.

9. The light-emitting module as claimed in claim 1, wherein the light-emitting structure further comprises:
an electronic component disposed on the circuit board, wherein the first positioning mark comprises the electronic component.

10. The light-emitting module as claimed in claim 1, wherein a shape of the first positioning mark is substantially the same as a shape of the second positioning mark.

11. The light-emitting module as claimed in claim 1, wherein the carrying substrate comprises metal material.

12. The light-emitting module as claimed in claim 1, further comprising a bonding layer disposed between the light-emitting structure and the carrying substrate.

13. The light-emitting module as claimed in claim 12, wherein the light-emitting structure further comprises a substrate having a first surface and a second surface, the plurality of light-emitting elements are disposed on the first surface, and the bonding layer is adhered between the second surface and the carrying substrate.

14. The light-emitting module as claimed in claim 12, wherein the circuit board is in contact with the bonding layer.

15. A tiled display device, comprising:
a cabinet; and
a plurality of light-emitting modules disposed in the cabinet, wherein at least one of the plurality of light-emitting modules comprises:
a light-emitting structure comprising a plurality of light-emitting elements, a circuit board, a solder pad, and a first positioning mark, wherein at least one of the plurality of light-emitting elements is electrically connected to the circuit board via the solder pad; and
a carrying substrate comprising a second positioning mark,
wherein the light-emitting structure is fixed on the carrying substrate along a direction, and the first positioning mark and the second positioning mark overlap in the direction and are not covered by the plurality of light-emitting elements, and wherein the first positioning mark is disposed in the circuit board, or the first positioning mark comprises a portion of the solder pad.

16. The tiled display device as claimed in claim 15, wherein the plurality of light-emitting elements are light-emitting diodes.

17. The tiled display device as claimed in claim 15, wherein the light-emitting structure further comprises a substrate and the circuit board is disposed on the substrate.

18. The tiled display device as claimed in claim 17, wherein the light-emitting structure further comprises an electronic component disposed on the circuit board, a second hole is formed in the carrying substrate, the first positioning mark comprises the electronic component, and the second positioning mark comprises the second hole.

19. The tiled display device as claimed in claim 15, further comprising an optical layer disposed between the plurality of light-emitting elements.

20. A display device, comprising:
a display panel; and
a light-emitting module providing a light source for the display panel, wherein the light-emitting module comprises:
a light-emitting structure comprising a plurality of light-emitting elements, a circuit board, a solder pad, and a first positioning mark, wherein at least one of the plurality of light-emitting elements is electrically connected to the circuit board via the solder pad; and
a carrying substrate comprising a second positioning mark,
wherein the light-emitting structure is fixed on the carrying substrate along a direction, and the first positioning mark and the second positioning mark overlap in the direction and are not covered by the plurality of light-emitting elements, and wherein the first positioning mark is disposed in the circuit board, or the first positioning mark comprises a portion of the solder pad.

\* \* \* \* \*